United States Patent
Miyamura et al.

(10) Patent No.: US 6,635,155 B2
(45) Date of Patent: Oct. 21, 2003

(54) METHOD FOR PREPARING AN OPTICAL THIN FILM

(75) Inventors: Masao Miyamura, Tokyo (JP); Kazuhiko Mitarai, Tokyo (JP); Satoru Takaki, Yokohama (JP)

(73) Assignee: Asahi Glass Company, Limited, Tokyo (JP)

(*) Notice: Subject to any disclaimer, the term of this patent is extended or adjusted under 35 U.S.C. 154(b) by 0 days.

(21) Appl. No.: 09/982,257

(22) Filed: Oct. 19, 2001

(65) Prior Publication Data

US 2002/0108848 A1 Aug. 15, 2002

(30) Foreign Application Priority Data

Oct. 20, 2000 (JP) ........................................ 2000-321654

(51) Int. Cl.⁷ .............................................. C23C 14/35
(52) U.S. Cl. ........................... 204/192.13; 204/192.12; 204/192.26; 204/192.27; 204/192.28
(58) Field of Search ..................... 204/192.12, 192.26, 204/192.27, 192.28, 192.13

(56) References Cited

U.S. PATENT DOCUMENTS

| | | | | |
|---|---|---|---|---|
| 4,142,958 A | | 3/1979 | Wei et al. ................. | 204/192 P |
| 4,497,700 A | * | 2/1985 | Groth et al. ............. | 204/192 P |
| RE32,849 E | | 1/1989 | Wei et al. ............... | 204/192.27 |
| 5,851,365 A | | 12/1998 | Scobey ................. | 204/192.12 |
| 5,879,519 A | * | 3/1999 | Seeser et al. .......... | 204/192.12 |
| 6,039,806 A | | 3/2000 | Zhou et al. ................. | 118/665 |

FOREIGN PATENT DOCUMENTS

| | | | |
|---|---|---|---|
| JP | 5-196810 | 8/1993 | |
| JP | 9-272973 | 10/1997 | |
| JP | 11-342354 | 12/1999 | |
| JP | 2000-178731 | 6/2000 | |
| WO | WO 95/00677 | 1/1995 | ........... C23C/14/34 |

* cited by examiner

*Primary Examiner*—Steven H. VerSteeg
(74) *Attorney, Agent, or Firm*—Oblon, Spivak, McClelland, Maier & Neustadt, P.C.

(57) ABSTRACT

A method for forming an optical thin film having multiple optical layers on the surface of a substrate using a magnetron sputtering apparatus with a sputtering chamber having cathodes, the substrate, and at least two kinds of targets disposed therein. An inert gas and a reactive gas are introduced into the sputtering chamber to form at least some of the multiple optical layers on the substrate by successively alternately repeatedly forming at least two kinds of optical layers each having a different optical constant by means of the reactive magnetron sputtering apparatus under a condition of a discharge pressure being no greater than $1.3 \times 10^{-1}$ Pa.

23 Claims, 1 Drawing Sheet

METHOD FOR PREPARING AN OPTICAL THIN FILM

DETAILED DESCRIPTION OF THE INVENTION

1. Technical Field of the Invention

The present invention relates to a method for preparing an optical thin film having multiple optical layers, particularly an optical thin film having multiple optical layers made of a dielectric material.

2. Prior Art

Heretofore, for the preparation of a dielectric optical thin film of a multi-layered film structure, it has been common to employ a film-forming method such as a vapor deposition method e.g. an electron beam evaporation, or a sputtering method e.g. an ion beam sputtering method. Particularly, in the field of optical communication, a dielectric optical thin film having multiple layers as many as 100 layers or more coated, is utilized as a narrow-band pass filter based on an interference effect of an optical multilayer film, to be used for high density transmission such as WDM (wavelength division multiplexing) or DWDM (dense wavelength division multiplexing), and a thin film-deposition process is desired to be operated in a stabilized condition over a long period of time during which a process for forming a multi-layer film continues and whereby the film thickness and the optical properties are controlled very precisely.

In order to produce such a dielectric optical multilayer thin film, a production method employing a vacuum evaporation method, has been proposed, for example, in JP-A-5-196810 or JP-A-11-342354. However, in a vacuum evaporation method, the evaporation source is basically a point source, whereby it is difficult to obtain a uniform film thickness distribution over a wide region of a substrate. Further, it is difficult to maintain the temperature distribution or the molten state of the substance for vapor deposition always uniform and constant, and it is difficult to maintain the evaporation process in a stabilized condition over a long period of time. Accordingly, it is difficult to constantly obtain a dielectric optical multilayer thin film of high precision required for the preparation of a filter for such WDM or DWDM.

Further, an optical thin film prepared by a usual vacuum evaporation process has a low packing density of atoms and is porous, and thus, it has had a problem in durability and a problem in the reliability as a filter. Among them, the reliability of the performance of an optical film may be improved by combined use of ion irradiation or plasma irradiation. However, problems in the stability or controllability of the vacuum evaporation are derived from the evaporation source itself, and such problems can hardly be solved even by ion or plasma irradiation.

On the other hand, JP-A-12-178731, etc. propose a production method employing an ion beam sputtering method, as a method for forming a multilayer type optical thin film to improve the controllability or stability of the vacuum evaporation process. However, ion beam sputtering has a drawback that the sputtering rate of a dielectric film is usually slow, and a long time is required to prepare a multilayer type optical thin film, and the productivity is low. Further, a trouble of the apparatus is a factor to lower the yield of the product as the operation takes a long period of time, and there is a problem that the productivity will thereby be further lowered. Further, the ion source itself and its consumable parts are expensive, and it is accordingly a serious problem from the viewpoint of the production that the operation cost will be very high.

In a magnetron sputtering method, a thin film is usually formed under a relatively high discharge pressure (at a level of about 1 Pa) as compared with a vacuum evaporation method, whereby there has been a problem in reliability such that the thin film to be formed is porous and has a low packing density, and there may be a deterioration of optical characteristics attributable to this low packing density, such as a change in the optical characteristics due to a change with time of e.g. the refractive index. Further, in a magnetron sputtering method particularly for an oxide thin film among dielectric films, the film deposition rate is slow, and if the discharge power is increased to improve the film deposition rate, an electric charge will be accumulated on the insulating film of dielectric deposited on the target surface or on the inner wall of the sputtering chamber, whereby the glow discharge tends to become unstable, and an abnormal discharge such as arcing is likely to take place, thus leading to formation of a defective film.

Further, in a typical magnetron sputtering method, the distance between the substrate and the target is short, whereby it has been difficult to attach an optical monitor, so it has been difficult to control the sputtering process precisely. For these reasons, a conventional magnetron sputtering method has not been applied to a process for preparing a dielectric optical multi-layered thin film wherein the number of stacked layers is many and highly precise control of the film thickness is required.

Problems to be Solved by the Invention

It is an object of the present invention to overcome the above-mentioned drawbacks of the prior art and to provide a method for preparing an optical thin film having multiple optical layers having a high packing density with little inclusion of impurities. A further object is to provide a method for preparing an optical thin film having multiple layers with good precision by a stabilized process excellent in productivity. Further, it is another object of the present invention to provide a method for preparing an optical thin film having multiple optical layers, which is still more excellent in packing density and less susceptible to a change with time of the optical characteristic such as the refractive index and which has the improved durability.

Further, it is another object of the present invention to provide a method for preparing an optical thin film having multiple optical layers, which is suitable for the production of a multilayer optical filter or the like, and whereby a sufficiently high deposition rate of the optical layer can be obtained, stability of discharge can be secured over a long period of time at the time of forming multiple optical layers, and highly precise controllability can be obtained.

Means to Solve the Problems

The present invention provides (1) a method for preparing an optical thin film, which comprises forming an optical thin film having multiple optical layers on a substrate by a magnetron sputtering apparatus having cathodes, the substrate and targets disposed in a sputtering chamber, wherein an inert gas and a reactive gas are introduced into the sputtering chamber, and optical layers are successively formed on the substrate by a reactive magnetron sputtering method under a condition of a discharge pressure of $1.3 \times 10^{-1}$ Pa at most.

In the present invention, as the inert gas, it is common to employ Ar gas, and as the reactive gas, $O_2$ gas or $O_2$ gas containing an inert gas is employed when an optical layer of oxide type is to be formed, or $N_2$ gas or $N_2$ gas containing an inert gas is employed when an optical layer of nitride type is to be formed. As other reactive gas, an optional gas may be employed depending upon the type of the desired optical layer. Further, as the target to be used, a planar target may be mentioned.

Further, the present invention provides (2) a method for preparing an optical thin film, which comprises forming an optical thin film having multiple optical layers on a substrate by a magnetron sputtering apparatus having cathodes, the substrate and targets disposed in a sputtering chamber, wherein prior to forming the optical thin film, the sputtering chamber is evacuated to $1.0 \times 10^{-4}$ Pa at most, then, an inert gas and a reactive gas are introduced into the sputtering chamber, and optical layers are successively formed on the substrate by a reactive magnetron sputtering method under a condition of a discharge pressure of $1.3 \times 10^{-1}$ Pa at most.

Still further, the present invention provides (3) the method for preparing an optical thin film according to the above (1) or (2), wherein the optical thin film has multiple layers obtained by successively alternately repeatedly forming at least two kinds of optical layers different in the optical constant, and said at least two kinds of optical layers different in the optical constant, are formed on the substrate successively in multiple layers by means of at least two kinds of targets for forming the respective optical layers.

In the present invention, prior to forming the optical thin film, the sputtering chamber is evacuated to a pressure of $1.0 \times 10^{-4}$ Pa at most, and then, an inert gas such as Ar gas and a reactive gas are introduced into the same sputtering chamber, whereby a reactive magnetron sputtering is carried out under a condition of a discharge pressure of $1.3 \times 10^{-1}$ Pa at most, whereby inclusion of impurities due to water vapor remaining in the sputtering chamber is in a very low level, and accordingly, an optical layer having a high packing density with little change with time of the optical characteristic such as the refractive index, can be obtained.

On the other hand, if the pressure in the sputtering chamber exceeds $1.0 \times 10^{-4}$ Pa prior to preparation of the optical thin film, an optical layer having an adequately high density can not be obtained due to water vapor remaining in the sputtering chamber during the sputtering, and accordingly, the optical characteristic tends to change by a change in the temperature or humidity, such being undesirable.

Even if the sputtering chamber is evacuated to a pressure of $1.0 \times 10^{-4}$ Pa at most, and Ar gas and a reactive gas are introduced into the sputtering chamber, in case that optical layers are successively formed on the substrate by the magnetron sputtering method under a discharge pressure in the sputtering chamber i.e. under an operation pressure, of higher than $1.3 \times 10^{-1}$ Pa, sputtered particles will reach the substrate without an adequate energy required for the formation of a dense optical layer, as they have already lost kinetic energy by multiple collision with an inert gas such as Ar gas in the sputtering chamber before reaching the substrate from the target. By the lack of sufficient kinetic energy, formation of a dielectric layer having a high packing density will be impaired.

Especially, in the formation of optical layers, in order to minimize the residual stress in the layers, heating is positively carried out during the sputtering, whereby Ar gas or Ar ions remaining in the sputtering chamber tend to be included in the optical layers, and as a result the packing density of the optical layers tends to be low. Accordingly, the optical characteristic tends to change depending on the temperature or humidity, such being undesirable.

Further, the present invention provides (4) the method for preparing an optical thin film according to the above (3), wherein said at least two kinds of optical layers different in the optical constant, are made of dielectric materials, respectively.

Further, the present invention provides (5) the method for preparing an optical thin film according to the above (4), wherein the optical thin film is an optical multi-layered thin film interference filter having selectivity for a transmission wavelength or a reflection wavelength.

Further, the present invention provides (6) the method for preparing an optical thin film according to the above (5), wherein the optical thin film having multiple optical layers is formed on the substrate by a magnetron sputtering apparatus having said at least two kinds of target mounted on the respective cathodes disposed at substantially the same distance from the position of the substrate, and optical layers having desired optical constants are formed successively in multiple layers by switching the target for sputtering for each optical layer.

Further, the present invention provides (7) the method for preparing an optical thin film according to the above (6), wherein using a magnetron sputtering apparatus having said at least two kinds of targets mounted on the respective cathodes disposed at substantially the same distance from the position of the substrate, an inert gas and a reactive gas are introduced into the sputtering chamber, and optical layers are successively formed on the substrate by a reactive magnetron sputtering method under a condition of a discharge pressure of $1.3 \times 10^{-1}$ Pa at most, and separately from the inert gas for sputtering, a reactive gas is introduced from very near to the substrate while the flow rate is adjusted.

Further, the present invention provides (8) the method for preparing an optical thin film according to the above (1) or (2), wherein gas in the sputtering chamber is evacuated from an exhaust port located near the substrate and on the opposite side of the substrate to the position of the target, so that the partial pressure of the reactive gas introduced from very near the substrate is minimized in the vicinity of the target, so as to minimize a decrease in the deposition rates of optical layers.

Further, the present invention provides (9) the method for preparing an optical thin film according to any one of the above (1) to (8), wherein at least one optical layer of the optical thin film is formed by using a magnetron sputtering apparatus having a plurality of targets disposed to form said optical layer, and the plurality of targets are sputtered simultaneously to obtain said optical layer.

Further, the present invention provides (10) the method for preparing an optical thin film according to the above (9), wherein the plurality of targets which are sputtered simultaneously, are made of the same material, and the reactive gas which is introduced, is of the same species.

Further, the present invention provides (11) the method for preparing an optical thin film according to the above (9), wherein the plurality of targets which are sputtered simultaneously, are made of different materials.

Further, in the present invention, by controlling the discharge powers to be supplied to the respective targets for simultaneous sputtering or the flow rates of the inert gas and the reactive gas, it is possible to form an optical thin film having the desired composition of each layer which have the desired optical constant.

Further, the present invention provides (12) the method for preparing an optical thin film according to any one of the above (1) to (11), wherein when the optical layers are formed on the substrate successively by the magnetron sputtering method, an ion beam is irradiated to the surface of the substrate on which the optical layers are formed.

Further, the present invention provides (13) the method for preparing an optical thin film according to any one of the above (1) to (11), wherein when the optical layers are formed on the substrate successively by the magnetron sputtering method, an RF electric power is supplied to the substrate. In the present invention, the RF electric power is supplied to the substrate to induce the substrate a negative bias voltage, and Ar ions and ions of the reactive gas are irradiated to the surface of the substrate on which optical layers are formed.

Further, the present invention provides (14) the method for preparing an optical thin film according to any one of the above (1) to (13), wherein when the optical layers are formed, abnormal discharge occurring in the sputtering chamber is suppressed by an electron gun for electrical neutralization.

In the case of irradiation of an ion beam to the substrate as in the above (12) or in the case of supplying a RF electric power to the substrate to apply RF bias as in the above (13), when optical layers are formed, an electron gun for electrical neutralization (an ion neutralizer) is used to suppress abnormal discharge and thereby to prevent the discharge from becoming unstable, by neutralizing a space charge in the sputtering chamber, an accumulated charge on the wall surface of the sputtering chamber, and an accumulated charge on the cathode and the target or in the vicinity thereof, by an electron stream supplied from the electron gun.

In the present invention, if a plurality of targets of the same material are simultaneously sputtered, the film-forming speed i.e. the deposition rate of each layer, can be improved to a large extent in proportion to the number of targets to be used.

Further, in the present invention, when a layer of a composite compound, such as a double oxide layer, a double nitride layer, a double boride layer, a double carbide layer, a silicon nitride layer or a boron nitride layer, is to be formed as an optical layer, in order to form such a composite compound layer, two or more targets made of different materials corresponding to formation of such a layer, may be used to carry out sputtering simultaneously. In such a case, by adjusting the distribution ratio of discharge powers among the plurality of targets, an optical layer having the desired composition and optical constant can be formed with good precision. Also in such a case, in the vicinity of the end point for formation of the optical layer, the layer forming speed may be slowed down by reducing the entire discharge power without changing the power ratio supplied to the targets, whereby the layer thickness can be controlled with high precision.

Further, in the present invention, by applying an RF electric power to the substrate during the simultaneous sputtering as mentioned above to irradiate plus ions in the vicinity of the substrate towards the surface of the substrate on which the optical layers are formed, or by irradiating an ion beam to the surface of the substrate on which the optical layers are formed, the packing density or the environmental reliability of the optical layers can further be improved.

In such a case, an oxygen ion beam may be used as an irradiation ion of the ion beam, or in a case where an inert gas ion is employed, oxygen gas may be supplied in the vicinity of the substrate, so that an oxide optical layer such as $SiO_2$ or $Ta_2O_5$ having an oxygen deficient composition may be subjected to an oxidation reaction sufficiently on the substrate, whereby an oxide optical layer having a complete and stable oxide composition, can be obtained. Likewise, in the case of a nitride optical layer, a nitride ion may be employed as the irradiation ion, or in a case where an inert gas ion is employed, nitrogen gas may be supplied in the vicinity of the substrate.

Further, the present invention provides (15) the method for preparing an optical thin film according to any one of the above (1) to (14), wherein an observation light for monitoring is irradiated to the surface of an optical layer formed on the substrate, via a lens system from a light source disposed inside or outside of the sputtering chamber, the intensity of light transmitted through the substrate or the intensity of light reflected from the surface of the optical layer, of the observation light, is measured by a photosensitive detector, the end point of sputtering for forming each optical layer is detected by an optical monitor whereby the thickness of the layer formed is obtained from the change in the intensity of light due to a change in the layer thickness of the optical layer formed, and the layer thickness of each optical layer is controlled to a desired layer thickness.

Further, the present invention provides (16) the method for preparing an optical thin film according to the above (15), wherein a plurality of optical monitors are disposed for one substrate, each optical monitor has a shutter to cover a region to be measured by the monitor, disposed immediately before the substrate, an operation is carried out in such a manner that at a region detected by one optical monitor, the corresponding portion of the shutter is opened, and when the end point of sputtering of an optical layer formed in this region is detected, the shutter portion corresponding to the same region is closed, then, a similar operation is carried out in such a manner that at a next region detected by a next optical monitor, the corresponding portion of the shutter is opened, and when the end point of sputtering of an optical layer formed in this region is detected, the shutter portion corresponding to the same region is closed, and such an operation is repeated for a predetermined number of times corresponding to the number of optical monitors successively disposed.

Further, the present invention provides (17) the method for preparing an optical thin film according to the above (15) or (16), wherein when an optical monitor detects that the end point is close to the desired layer thickness of the optical layer, the deposition rate of the optical layer is slowed down to control the layer thickness.

When the speed of forming the optical layer is slowed down, the layer thickness (the film thickness) can be controlled more accurately.

In a case where, in order to form one kind of optical layer, at least two targets made of the same material are disposed in the sputtering chamber, and these targets are simultaneously sputtered to form one optical layer, when the measured values of the optical monitors which determine the thickness of the layer from the change in the intensity of light due to the change in the thickness of the formed layer by the above optical monitors, indicate that the thicknesses of the formed layer has become close to the desired value, discharge of only one target is continued, and discharge of the other targets is stopped, whereby the entire layer-forming speed can be slowed down, and the end point time can more accurately be measured and controlled. As a result, an optical thin film having a very accurate thickness as designed can be obtained. Further, the present invention provides (18) the method for preparing an optical thin film according to any one of the above (1) to (17), wherein as each cathode, a cathode having a magnet disposed so that an erosion region of a target would be the entire region of the target surface, or a cathode having a movable magnet and having a construction such that the magnet moves so that an erosion region of a target would be the entire region of the target surface, is employed.

In order to attain a magnetic field distribution so that an erosion region of a target would be the entire region of the target surface, a cathode having the disposition (if necessary the shape) of the magnet so adjusted, may be employed, or a cathode whereby the magnet eccentrically rotates or swings, may be employed. In the present invention, it is only required that the erosion region would be the entire region of the target surface, and the present invention is not limited to a magnetron discharge wherein the directions of the electric field and the magnetic field cross perpendicularly each other. As the magnet to be used, it is preferred to use a strong magnet, such as a rare earth magnet (neodium/iron magnet or samarium/cobalt magnet), from the viewpoint of widening the discharge pressure region as far as possible towards the low pressure side or from the viewpoint of making the erosion region to be the entire region of the target surface.

In the sputtering, a substance (i.e. a dielectric substance which forms during the reactive sputtering) which causes arcing will deposit on the metal target surface, while a phenomenon takes place wherein metal atoms or their reaction products (such as metal oxides) on the target surface are subjected to sputter etching mainly by inert gas ions (hereinafter represented by Ar ions). At the target surface, competing reactions i.e. the above-mentioned deposition and sputter etching, are always taking place. When the discharge electric power is sufficiently large, or at the erosion region, sputter etching will be the dominant process, and sputtering can be continued stably. However, in a case where supply of the reactive gas is large, even at the erosion region, deposition of a dielectric substance will be the dominant process, and if an electric charge is accumulated on that dielectric deposits, arcing is likely to occur, and further, discharge will be terminated.

The pressure commonly used in usual magnetron sputtering is a high pressure at a level of from 0.4 to 5 Pa, and by introducing the inert gas in the vicinity of the target and the reactive gas in the vicinity of the substrate, and by increasing the pressure in the vicinity of the target while suppressing the pressure in the vicinity of the substrate to a low level, a gas flow is induced. By utilizing this gas flow, diffusion of the reactive gas to the target surface can be prevented, whereby deposition of a substance causing arcing on the target surface can be prevented to some extent.

However, in the sputtering under a low pressure as in the present invention, the gas flow becomes a molecular flow, and the mean free path of the gas becomes close to the size of the apparatus, whereby the prevention of diffusion of the reactive gas utilizing the above-mentioned gas flow can not be expected. Accordingly, in the sputtering under low pressure as in the present invention, the method of suppressing arcing by means of the cathode as mentioned in the above (18) is very effective.

By using the cathode as described in the above (18), the erosion region of the target will be the entire region of the target surface, whereby a dielectric substance causing arcing tends to hardly deposit on the surface of the target, whereby arcing is suppressed, and consequently, application of a large electric power will be possible, and deterioration of the film quality or film defects caused by arcing can be suppressed.

In the present invention, a multilayer film is formed, and accordingly, optical absorption of each dielectric thin film is preferably minimum. Accordingly, in order to let the dielectric thin film have a stoichiometrical composition, the amount of the reaction gas to be supplied into the chamber is relatively large, but by the use of the above cathode, arcing can be suppressed, whereby the discharge electric power to be supplied to the target can be increased, and film deposition can be carried out easily, constantly and efficiently.

Further, suppression of the deterioration of the film quality or film defects is extremely important from the viewpoint of the productivity (prevention of the deterioration of the yield) in lamination of multiple layers. Further, as the erosion region of the target becomes the entire region of the target surface, the utilization efficiency of the target will be improved.

Embodiments of the Invention

An example of a magnetron sputtering apparatus to be used for the preparation of the optical thin film of the present invention, is shown in FIG. 1. In FIG. 1, in a sputtering chamber 1, i.e. in a vacuum chamber, cathodes 2, targets 4 and a substrate holder 9 on which substrates 8 are mounted, are disposed. It is so designed that a plurality of substrates 8 are to be mounted on the substrate holder 9. Although not shown, magnets are respectively disposed on the rear sides of the cathodes (opposite sides of the sides on which the targets are to be mounted). The material of the target is selected from the material corresponding to the optical layer to be formed. For example, a target made of a metal material or a target made of a dielectric material may be used.

In a case where a narrow-band pass filter utilizing interference effects of an optical multilayer film to be used for high density telecommunication such as WDM or DWDM, is produced, for example, 1) in a case where an optical thin film having $SiO_2$ layers and $Ta_2O_5$ layers alternately laminated in multiple layers, is produced, or 2) in a case where an optical thin film having $SiO_2$ layers and $Nb_2O_5$ layers (or $TiO_2$ layers) alternately laminated in multiple layers, is produced, a target made of a material such as Si or $SiO_2$, Ta or $Ta_2O_5$, Ti or $TiO_2$, or Nb or $Nb_2O_5$, is used.

The material for the substrate to be used in the present invention may, for example, be crystallized glass (such as "WMS13", manufactured by Ohara K. K.) or an optical glass (such as borosilicate crown glass, specifically e.g. "BK-7" manufactured by Shot Co.).

The sputtering chamber 1 is provided with a vacuum pump 6 capable of ultra high vacuum evacuation, and prior to the preparation of the optical thin film, evacuation is carried out until the pressure in the sputtering chamber reaches $1.0 \times 10^{-4}$ Pa at most. Reference numeral 7 indicates a gas supply system to supply a sputtering gas made of an inert gas such as Ar gas, or a reactive gas such as oxygen or nitrogen. For example, in the case of a reactive sputtering method, it will be a gas supply system for $O_2$ gas, $N_2$ gas or a mixed gas of $O_2$ gas (or $N_2$ gas) and Ar gas, as a reactive gas, and such a gas is supplied to the sputtering chamber 1.

Further, reference numeral 71 indicates a gas inlet for the inert gas, and numeral 72 indicates a gas inlet for the reactive gas. In a case where a reactive gas such as $O_2$ gas which changes the bonding state of the target surface thereby to influence the sputtering rate, is introduced, it is preferred that the gas inlet 72 and the exhaust port 61 connected to a vacuum pump are disposed in the vicinity of the substrate 8, so that the reactive gas will not give any influence around the target 4 as far as possible. Accordingly, it is preferred that the exhaust port 61 is located near the substrate 8 and at a position on the opposite side of the substrate to the position of the target 4.

Further, the substrate holder 9 is provided with a rotating mechanism 11, so that the substrate 8 can be rotated at a high speed. Further, the substrate holder 9 is provided with an RF electric power supply system 12 to give a RF bias to the substrate. For the formation of an optical thin film, an insulating substrate such as an optical glass is usually used as the substrate, and in order for the RF bias to be uniformly applied over the entire substrate, the substrate-holding table portion of the substrate holder (i.e. the portion in contact with the substrate, in the substrate holder) is made of a conductive material, or in a case where the substrate-holding table portion is made of an insulating material, one having a conductive film formed on the substrate side, is employed.

On the other hand, as an optical monitor, a light receiver 10 for an observation light for monitoring is provided below the substrate 8, and a light source 3 for the observation light (such as a laser beam) for monitoring is provided above the substrate 8, and using these light source 3 and light receiver 10, sputter deposition can be carried out while accurately monitoring the optical film thickness by utilizing the transmission characteristics of the observation light. The light source 3 and the light receiver 10 may be installed in the sputtering chamber 1 by means of e.g. an optical fiber. Further, the light source and the light receiver may be installed above the substrate 8, so that film-forming may be carried out by accurately monitoring the optical film thickness by utilizing the reflection characteristic of light. In a case where in the measurement with a single use of transmission or reflection, no adequate S/N ratio is obtainable, and the film thickness can not precisely be monitored, both transmission and reflection may be used in combination for complementary measurement, whereby the precision in control of the film thickness can be improved.

In order to satisfy both uniform application of a RF bias over the entire substrate and transmission of the observation light for monitoring in the case of using an optical monitor of the type which measures the change in the intensity of transmitted light through the substrate, it is necessary that a light-transmitting perforation is formed in the substrate-holding table portion of the substrate holder to permit the observation light for monitoring to transmit therethrough, so that the observation light for monitoring will enter into the light receiver installed below the substrate-holding table portion. In a case where the distribution of discharge induced by the RF bias is disturbed at the light-transmitting perforation, as a result of forming the light-transmitting perforation, it is preferred to interpose a transparent substrate (a substrate having no perforation) having a transparent conductive film applied, between the substrate and the substrate-holding table portion coated with a conductive film, so as to make as if the above light transmitting perforation were not present.

Further, FIG. 1 shows an example wherein two cathodes are provided to form at least two kinds of optical layers different in the optical constant, but to successively continue the simultaneous sputtering as in the above (9) to (11), at least four cathodes and targets are required. These cathodes and targets are not particularly limited with respect to the upper limits of their numbers, so long as they are symmetrically disposed around the rotation axis with the substrate 8 at the center, as observed from the upper portion of the sputtering chamber 1.

Instead of applying an RF bias to the above substrate to improve the density of the optical layer, any one of the cathodes 2 may be replaced by an ion source, or a separate ion source 14 may be mounted, so that e.g. Ar ions beams or oxygen ion beams may be irradiated to the surface of the optical layer being formed on the substrate, simultaneously during the sputtering to form the optical layer. By either method, higher density of the optical layer, and consequently improvement in the environmental reliability, can be realized. As the ion source, a magnetron type ion source or a RF ion source may, for example, be used.

The magnetron discharge for sputtering is carried out at a low pressure, whereby the ion beams of e.g. the above Ar ions or oxygen ions will not substantially be scattered and will effectively irradiate the optical thin film which is being formed on the substrate to supply an energy to promote the reaction at the layer surface to bring about high density film. Thus, such is more effective than the RF bias method.

Further, by an electron gun 5 for electrical neutralization attached to the ion source, abnormal discharge resulting from an accumulation of electrical charge on the film surface of a dielectric (insulating material) sputtered on the inner wall of the sputtering chamber, can be prevented. By the neutralization of the electrical charge by the electron gun for electrical neutralization, abnormal discharge can effectively be suppressed even when no ion source is used, no RF bias method is used, or neither is used.

By means of the above-described apparatus, a multi-layered optical interference filter wherein $SiO_2$ layers and $Ta_2O_5$ layers are alternately laminated in a large number of layers, or a multi-layered optical interference filter wherein $SiO_2$ layers and $Nb_2O_5$ layers (or $TiO_2$ layers) are alternately laminated in a large number of layers, can be prepared at a high speed and yet under precise control of the film thickness.

The sputtering chamber 1 is evacuated so that the remaining gas pressure will be sufficiently low at a level of $1.0 \times 10^{-4}$ Pa at most thereby to prevent deterioration of the reliability of the optical multi-layered thin film caused by inclusion of the remaining water vapor in the layer. Especially in the case of the present invention where sputtering is carried out under a low pressure, it is preferred to evacuate the sputtering chamber to a sufficiently low pressure at a level of $1.0 \times 10^{-4}$ Pa at most prior to sputter deposition of the optical thin film. After introducing a desired gas from a gas inlet system 7 into the sputtering chamber 1, target material particles sputtered under a discharge pressure of $1.3 \times 10^{-1}$ Pa at most, will fly to the substrate 8 and form an optical layer. At that time, by discharging a plurality of targets simultaneously, the deposition rate can be increased to a level of more than twice.

Further, optical layers made of at least two kinds of dielectric materials different in the optical constant can be alternately formed in multiple layers on the substrate 8 by receiving an energy of ions in a plasma accelerated by a negative bias voltage introduced from a RF power supply system 12 or Ar ion irradiation from the above ion source 14, as the case requires. For example, in the case of producing a narrow band pass filter utilizing interference effects of an optical multi-layered film, to be used for a high density telecommunication such as WDM or DWDM, dense multiple thin films of $SiO_2$ and $Ta_2O_5$ can be alternately formed on the substrate 8 by the above method.

At the time of controlling the layer-forming process by a signal from the light receiver 10 of the above-mentioned monitoring light to bring the thickness of the optical layer accurately to the desired level, immediately before reaching the desired layer thickness, only one target may, for example, be permitted to continue the discharge, and other targets may be terminated, so that the entire layer-forming speed is slowed down, whereby control can be made while accurately measuring the end point time, and consequently, an optical layer having a desired thickness can be obtained with very good precision. In order to obtain multiple optical layers, then, another desired target is permitted to discharge again to form a desired optical layer on the substrate 8, and the same operation as described above may be repeated.

In a case where plural number of different targets are subjected to low pressure discharge simultaneously, the electric power may be reduced immediately before the end point without changing the distribution ratio of the discharge powers to be supplied to the plurality of targets, to slow down the layer-forming speed, and thereafter, when the desired thickness is reached, the discharge may immediately be terminated, or the shutter 13 located just before the substrate 8 may be closed.

From the productivity, it is very important to prepare an optical thin film having multiple layers having uniform layer thicknesses and optical characteristic distributions over a wide area of the substrate, as well as to accurately control the layer thicknesses. For this purpose, uniformity of the layer thickness distribution on the substrate 8 can be attained usually by rotating the substrate 8 on the substrate holder 9 at a rotational speed of from 100 to 1,000 rpm by a rotation mechanism 11 during sputtering.

Further, in the production of an optical multi-layered thin film filter, it is required to have a narrower pass band, however it is difficult to satisfy the desired optical characteristics except for a region in the vicinity where the layer thickness is measured by an observation light for monitoring. Therefore, a plurality of optical monitor systems may be attached to one substrate, and regions detected by the respective monitors may be made to be independently opened or closed by divided shutters 13, whereby uniformity of the layer thickness over a wide area can be secured.

EXAMPLES

Example 1

One sheet of transparent glass substrate (a circular substrate having a diameter of 200 mm) having a thickness of 7 mm is mounted on a substrate holder of a magnetron sputtering apparatus shown in FIG. 1. On a first cathode, a Si target is mounted, and on a second cathode, a Ta target is mounted. Prior to the preparation of an optical thin film, the sputtering chamber is evacuated to a level of $0.8 \times 10^{-4}$ Pa. Then, Ar gas as an inert gas and $O_2$ gas as a reactive gas, are introduced into the same sputtering chamber, and the Si target and the Ta target are successively switched and sputtered under a condition of a discharge pressure of $1.1 \times 10^{-1}$ Pa, so that a $SiO_2$ optical layer having a layer thickness of 270 nm and a $Ta_2O_5$ optical layer having a layer thickness of 190 nm are successively alternately laminated on the above substrate surface by a magnetron sputtering method to produce a narrow band pass filter for WDM having a total laminated layer number of 127 layers.

At the time of forming an optical layer, the Ar gas is introduced from a gas inlet 71 into the sputtering chamber, and a mixed gas of $O_2$ gas and Ar gas (the proportion of the Ar gas being 20 vol %) is introduced from a gas inlet 72 into the sputtering chamber so that it is directed to immediately near the substrate 8. The total gas flow rate is about 10 sccm.

Further, the volume ratio of the gases introduced from the gas inlets 71 and 72, respectively, into the sputtering chamber is about 2:1 at the time of forming the $SiO_2$ layer, or about 1:2 at the time of forming the $Ta_2O_5$ layer. In a case where irradiation of an oxygen ion beam is carried out at the time of forming each optical layer, a mixed gas to be supplied to immediately near the substrate, is supplied to an ion source, so that about 200 eV of oxygen ion beam is irradiated to the substrate, and at the same time, an electron gun for electrical neutralization is operated to suppress abnormal discharge. Further, at the time of forming the optical layer, the substrate holder is rotated at a rotational speed of about 500 rpm.

Further, with respect to each optical layer, a laser beam as an observation light for monitoring is irradiated from a light source located outside the sputtering chamber through a lens system to the surface of the substrate rotating at a high speed, and the intensity of light of the laser beam transmitted through the substrate and the formed optical layer is measured by a light receiver, whereupon the end point of sputtering is detected by an optical monitor which calculates the thickness of each layer from a change in the light intensity due to a change in the formed layer thickness, and as a result, the optical layer is prepared under control of the layer thickness to the desired level accurately.

The film to be formed in this Example has a small extinction coefficient, and its refractive index is close to the value of bulk material. From such an extinction coefficient or the refractive index value, it is evident that a film formed may have a high-density containing little impurity component.

As described in the foregoing, it is possible to obtain a narrow band pass filter for WDM which contains little impurity component such as water molecules, has excellently high density and has improved durability and wherein a $SiO_2$ layer and a $Ta_2O_5$ layer are alternately laminated in a total laminated layer number of 120 layers, with good productivity constantly.

Example 2

A substrate made of crystallized glass ("WMS13", manufactured by Ohara K. K., diameter: 265 mm, thickness: 10 mm) is set on a substrate holder of a magnetron sputtering apparatus shown in FIG. 1. On a first cathode, a Si target (diameter: 7 inches) is mounted, and on a second cathode, a Ta target (diameter: 7 inches) is mounted. Here, both the first and second cathodes are cathodes having a construction such that a samarium-cobalt magnet is eccentrically rotated so that the erosion region of the target will be the entire region of the target surface.

Then, the sputtering chamber is evacuated to a level of $1 \times 10^{-4}$ Pa at most. Then, Ar gas is supplied at a flow rate of 10 sccm, and the shutter is closed for 15 seconds to carry out preliminary discharge to clean the surface of the Ta target.

Then, 7 sccm of Ar gas and 29 sccm of $O_2$ gas are introduced, and a direct current power of 3 kW (12 W/cm$^2$) is supplied to the second cathode to which a Ta target is attached, for discharge, whereby formation of a $Ta_2O_5$ layer is carried out until the layer thickness will be 185 nm. The pressure within the sputtering chamber at that time is $0.6 \times 10^{-1}$ Pa, and the discharge voltage is 540 V.

Then, Ar gas is supplied at a flow rate of 10 sccm, and the shutter is closed for 15 seconds to carry out preliminary discharge to clean the surface of the Si target.

Then, 10 sccm of Ar gas and 28 sccm of $O_2$ gas are introduced, and a direct current power of 3 kW (12 W/cm$^2$) is supplied to the first cathode to which a Si target is attached, for discharge, to carry out formation of a $SiO_2$ layer until the layer thickness will be 265 nm. The pressure in the sputtering chamber at that time is $0.8 \times 10^{-1}$ Pa, and the discharge voltage is 640 V.

In the same manner as described above, a $Ta_2O_5$ layer having a layer thickness of 185 nm and a $SiO_2$ layer having a layer thickness of 265 nm are successively alternately laminated to produce a narrow band pass filter for WDM (100 GHz specification) having a construction of (HL)7-H-8L-(HL)7-H-L-(HL)8-H-8L-(HL)8-H-8L-(HL)8-H-8L-(HL)8-H-L-(HL)7-H-8L-(HL)7-H (total number of layers: 135 layers). Here, H represents a $Ta_2O_5$ layer having a layer thickness of 185 nm, L represents a $SiO_2$ layer having a layer thickness of 265 nm, and (HL)7 means that H and L are alternately laminated 7 times. Further, 8L means that the thickness of the L layer is as thick as 8 times (i.e. 2120 nm).

Further, at the time of forming each optical layer, the substrate holder is rotated at a rotational speed of about 500 rpm.

Further, with respect to each optical layer, a laser beam as an observation light for monitoring is irradiated from a light source located outside the sputtering chamber, through a lens system, to the surface of the substrate rotating at a high speed, whereby the intensity of light of the laser beam transmitted through the substrate and the formed optical layer, is measured by a light receiver, and the end point of sputtering is detected by an optical monitor which calculates the layer thickness of each layer from the change in the light intensity due to a change in the thickness of the formed layer, to prepare the optical layer under control of the layer thickness to a desired level accurately.

In this Example, a large amount of oxygen is introduced, and high discharge power is applied. Nevertheless, the discharge state is constant during the film formation of 135 layers. By using a cathode so that the erosion region of the target will be the entire region of the target surface, as in this Example, abnormal discharge can easily be suppressed.

Further, the deposition rate of the $Ta_2O_5$ film is at least 1 nm/sec., the refractive index at a wavelength of 1550 nm is 2.09, and the extinction coefficient is less than 0.0001 (a film showing an extremely small light absorption) Further, the deposition rate of the $SiO_2$ film is at least 1 nm/sec, the refractive index at a wavelength of 1550 nm is 1.46, and the extinction coefficient is less than 0.0001 (a film showing an extremely small light absorption). From such an extinction coefficient or a refractive index value, it is evident that a film formed may have a very high density containing little impurity component.

According to this Example, it is possible to obtain a narrow band pass filter for WDM of 135 layers, which contains little impurity component such as water molecules, has excellently high density and has improved durability, with good productivity constantly.

Effects of the Invention

According to the present invention, it is possible to obtain an optical thin film of multilayer type, particularly an optical thin film made of dielectric multiple layers, which contains little impurity component and which has further a very high density, has little change with time of optical characteristics such as the refractive index, has improved durability and has a film thickness of a very high precision and for which optional optical characteristics are required. Further, for such an optical thin film of multilayer type, a thin film production process can be carried out which is excellent in mass productivity and also excellent in stability and controllability.

Especially, the present invention is most suitable for producing a narrow band pass filter for WDM having high durability and high quality wherein a $SiO_2$ layer and a $Ta_2O_5$ layer are alternately laminated in multiple layers in a total laminated layer number of as many as from about 90 layers to 150 layers, constantly with good productivity.

EXPLANATION OF SYMBOLS

Figure 1:
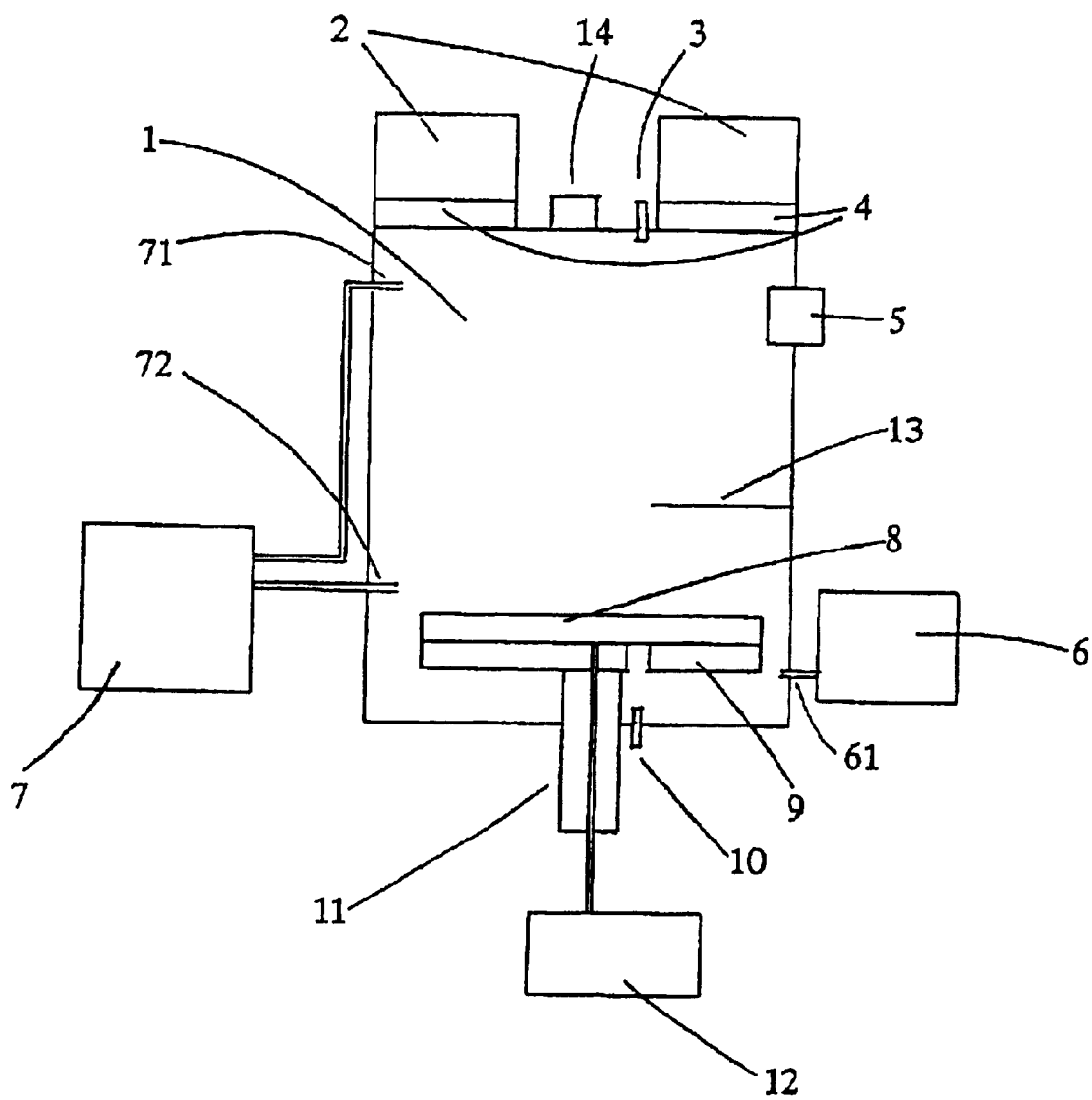
FIG. 1 is a schematic view of a magnetron sputtering apparatus to be used in the present invention.

1: Sputtering chamber
2: Cathode
3: Light source for optical monitor
4: Target
5: Electron gun for electrical neutralization
6: Vacuum pump
7: Gas inlet system
8: Substrate
9: Substrate holder
10: Light receiver of an optical monitor
11: Rotation mechanism
12: RF power supply system
13: Shutter
61: Pumping port
71: Gas inlet for an inert gas
72: Gas inlet for a reactive gas

What is claimed is:

1. A method for preparing an optical thin film having multiple optical layers on a substrate using a magnetron sputtering apparatus having cathodes and at least two kinds of targets disposed in a sputtering chamber of the magnetron sputtering apparatus along with the substrate, said method comprising the steps of:

introducing an inert gas and a reactive gas into the sputtering chamber; and forming at least some of the multiple optical layers on the substrate by successively alternately repeatedly forming at least two kinds of optical layers each having a different optical constant by means of the reactive magnetron sputtering apparatus under a condition of providing a discharge pressure no greater than $1.3 \times 10^{-1}$ Pa.

2. The method for preparing an optical thin film according to claim 1, further comprising the step of evacuating the sputtering chamber to a pressure no greater than $1.0 \times 10^{-4}$ Pa prior to introducing the inert gas and reactive gas into the sputtering chamber.

3. The method for preparing an optical thin film according to claim 2, wherein said at least two kinds of optical layers are made of dielectric materials.

4. The method for preparing an optical thin film according to claim 3, wherein the optical thin film is a multi-layered thin film optical interference filter having selectivity for a transmission wavelength or a reflection wavelength.

5. The method for preparing an optical thin film according to claim 2, wherein said at least two kinds of targets are each mounted on respective cathodes that are each disposed at substantially the same distance from the substrate, and said at least two kinds of optical layers are formed by switching between the at least two kinds of targets for sputtering each of said at least two kinds of optical layers.

6. The method for preparing an optical thin film according to claim 5, further comprising introducing the reactive gas very near to the substrate while adjusting gas flow rate.

7. The method for preparing an optical thin film according to claim 2, further comprising evacuating gas in the sputtering chamber from an exhaust port located near a main surface of the substrate that is farthest from the at least two kinds of targets, so that partial pressure of the reactive gas being introduced from a gas inlet very near the substrate is minimized in the vicinity of the at least two kinds of targets so as to minimize a decrease in the film-forming rate of the multiple optical layers.

8. The method for preparing an optical thin film according to claim 1, wherein said at least two kinds of optical layers are made of dielectric materials.

9. The method for preparing an optical thin film according to claim 8, wherein the optical thin film is a multi-layered thin film optical interference filter having selectivity for a transmission wavelength or a reflection wavelength.

10. The method for preparing an optical thin film according to claim 1, wherein said at least two kinds of targets are each mounted on respective cathodes that are each disposed at substantially the same distance from the substrate, and said at least two kinds of optical layers are formed by switching between the at least two kinds of targets for sputtering each of said at least two kinds of optical layers.

11. The method for preparing an optical thin film according to claim 10, further comprising introducing the reactive gas very near to the substrate while adjusting gas flow rate.

12. The method for preparing an optical thin film according to claim 1 further comprising evacuating gas in the sputtering chamber from an exhaust port located near a main surface of the substrate that is farthest from the at least two kinds of targets, so that partial pressure of the reactive gas being introduced from a gas inlet very near the substrate is minimized in the vicinity of the at least two kinds of targets, so as to minimize a decrease in the film-forming rate of the multiple optical layers.

13. The method for preparing an optical thin film according to claim 1, said method further comprising sputtering at least two of the at least two kinds of targets simultaneously to obtain at least one optical layer of said multiple optical layers.

14. The method for preparing an optical thin film according to claim 13, wherein the at least two kinds of targets which are sputtered simultaneously are each made of a same material and the reactive gas is of a same species.

15. The method for preparing an optical thin film according to claim 13, wherein the at least two kinds of targets which are sputtered simultaneously are made of different materials.

16. The method for preparing an optical thin film according to claim 1, further comprising irradiating an ion beam onto the multiple optical layers as they are being formed.

17. The method for preparing an optical thin film according to claim 1, further comprising applying RF electric power to the substrate during the forming of the multiple optical layers.

18. The method for preparing an optical thin film according to claim 1, further comprising suppressing abnormal discharge occurring in the sputtering chamber when the multiple optical layers are being formed by using an electron gun for electrical neutralization.

19. The method for preparing an optical thin film according to claim 1, further comprising providing at least one optical monitor performing a monitoring operation by irradiating monitoring light from a light source disposed inside or outside of the sputtering chamber on or through the surface of the multiple optical layers being formed on the substrate and detecting an intensity of the monitoring light reflected from the surface of the multiple optical layers being formed or the intensity of the monitoring light transmitted through the multiple optical layers being formed with a detector that provides a monitoring condition signal indicating a desired layer thickness has been obtained.

20. The method for preparing an optical thin film according to claim 19, further comprising:

providing N optical monitors associated with N shutters to monitor N regions associated with the multiple optical layers being formed on the substrate in N sequential region monitoring operations, with $N \geq 2$; and sequentially controlling each particular shutter of the N shutters to be open to expose a corresponding particular region of the N regions to monitoring by an associated one of the N optical monitors while all others of the N shutters remain closed during each of the N sequential region monitoring operations.

21. The method for preparing an optical thin film according to claim 20, further comprising slowing down the optical layer sputtering rate when the monitoring condition signal from a particular one of the N optical monitors indicates that the desired optical layer sputtered thickness is close to being obtained in the particular regions of the N regions being monitored.

22. The method for preparing an optical thin film according to claim 19, further comprising slowing down the optical layer sputtering rate when the monitoring condition signal from the at least one optical monitor indicates that the desired optical layer sputtered thickness is close to being obtained.

23. The method for preparing an optical thin film according to claim 1, further comprising disposing or moving a magnet relative to each cathode in a manner providing an erosion region of each target to be an entire surface of that target.

* * * * *